(12) United States Patent
Yoon et al.

(10) Patent No.: US 6,518,165 B1
(45) Date of Patent: Feb. 11, 2003

(54) METHOD FOR MANUFACTURING A SEMICONDUCTOR DEVICE HAVING A METAL LAYER FLOATING OVER A SUBSTRATE

(75) Inventors: Jun Bo Yoon, Taejon (KR); Chul Hi Han, Taejon (KR); Eui Sik Yoon, Taejon (KR); Choong Ki Kim, Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/763,401

(22) PCT Filed: Jul. 27, 1999

(86) PCT No.: PCT/KR99/00408

§ 371 (c)(1),
(2), (4) Date: Feb. 22, 2001

(87) PCT Pub. No.: WO00/07218

PCT Pub. Date: Feb. 10, 2000

(51) Int. Cl.⁷ .......................................... H01L 21/4763
(52) U.S. Cl. ...................................... 438/619; 438/622
(58) Field of Search ............................ 438/52–53, 619, 438/622–624

(56) References Cited

U.S. PATENT DOCUMENTS

| 4,857,481 A | * | 8/1989 | Tam et al. .................. 430/315 |
| 5,446,311 A | | 8/1995 | Ewen et al. |
| 5,478,773 A | | 12/1995 | Dow et al. |
| 5,539,241 A | | 7/1996 | Abidi et al. |
| 5,773,870 A | | 6/1998 | Svet et al. |
| 6,060,381 A | * | 5/2000 | Nakagawara et al. ....... 438/619 |

FOREIGN PATENT DOCUMENTS

WO   WO 97/45873 A   12/1997

* cited by examiner

Primary Examiner—Jey Tsai
(74) Attorney, Agent, or Firm—Bacon & Thomas (57) ABSTRACT

A method for manufacturing a semiconductor device where a passive element, such as, an inductor, is floating over a substrate, where an integrated circuit is formed, such that the overall area of the semiconductor device may be highly reduced. According to the present invention, a first metal layer is formed on the substrate, a first masking layer is formed on a portion of the first metal layer, a second metal layer is formed on other portion of the first metal layer on which the first masking layer is not formed, and a second masking layer is formed on the first masking layer and the second metal layer. Then, the first masking layer and a portion of the second masking layer which includes a portion which covers the first masking layer is removed, a third metal layer is formed on portions of the first and second metal layers which are exposed by the step of removing the first masking layer and the portion of the second masking layer. Finally, the second masking layer, the second metal layer; and the first metal layer except a portion which the third metal layer covers are removed. In this way, the area for integrating various passive elements can be saved and the overall area for the semiconductor device including the integrated circuit and the passive elements may be reduced.

29 Claims, 10 Drawing Sheets

METHOD FOR MANUFACTURING A SEMICONDUCTOR DEVICE HAVING A METAL LAYER FLOATING OVER A SUBSTRATE

TECHNICAL FIELD

The present invention relates to a semiconductor device having 3-dimensional structure and a method for manufacturing the semiconductor device, and more particularly, to a semiconductor device wherein passive elements, such as, inductors, capacitors, micro-switches, and waveguides, are formed over an integrated circuit (IC) which is arranged on the substrate.

BACKGROUND ART

Conventional integrated circuit technology was begun from U.S. Pat. No. 3,138,743, which was issued to J. S. Kilby in 1964. The '743 patent discloses a technique for integrating various electronic devices, including passive elements, over a planar semiconductor substrate. According to the '743 patent, passive elements are integrated on the planar surface of a semiconductor substrate. Therefore, size of a manufactured chip was large. Moreover, the passive elements suffered from the parasitic effects from the substrate since they were in contact with the substrate. These problems become noticeable when the technique is applied to radio-frequency (RF) ICs.

Recently, many RF ICs employ off-chip passive elements which are disposed outside of the chip. The off-chip passive elements, however, increase size of an overall system. Also, cost for fabricating the overall system increases when the off-chip passive elements are employed.

Even manufactured by the conventional integrated circuit technology, resistors and capacitors may satisfy the requirements of present IC applications. However, the integration of inductors has been unsuccessful for a long time.

Conventional integrated inductors were mainly planar-type spiral inductors. The spiral inductors occupy large area on a substrate. Moreover, the area of an inductor, whose inductance value satisfies the requirement for general high-frequency devices, should be larger than any other passive elements and even larger than active devices such as a transistor. Further, the conventional spiral inductor inevitably has substrate loss, which stems from parasitic effects due to the contact with a substrate. Also, the thickness of a metal line, which can be formed by the conventional integration technique, cannot exceed 5 $\mu$m. Therefore, the conventional spiral inductor has high series resistance and small capacity of current flow. Large series resistance and substrate loss decreases the quality (Q) factor, which is one of the most important characteristics for an inductor, and reduces the frequency where maximum Q factor occurs.

It is known to improve quality of a spiral inductor which is formed in an oxide layer overlying a silicon substrate, by selectively removing the silicon material underneath the inductor to reduce parasitic capacitance. This technique of removing silicon material underneath an inductor is disclosed in U.S. Pat. No. 5,539,241, issued on Jul. 23, 1996 to A. A. Abidi, et al., U.S. Pat. No. 5,773,870, issued on Jun. 30, 1998 to S. Su et al., and U.S. Pat. No. 5,844,299, issued on Dec. 1, 1998 to R. B. Merrill, et al. The three patents, however, did not allow integration of circuit underneath the inductor. Therefore, additional area for the circuit is necessary. Moreover, the process of removing the substrate underneath an inductor does not compatible with the process of integrating a circuit.

As an another technique, it is known to insert a thick layer of dielectric material, such as, polyimide, between an inductor and substrate to reduce parasitic capacitance to the substrate. This technique is employed in U.S. Pat. No. 5,478,773, issued on Dec. 26, 1995 to S. D. Chandler, et al. and U.S. Pat. No. 5,804,043, issued on Sep. 8, 1998 to l. J. Bahl.

The '773 patent suggested that resistance of an inductor could be reduced by using copper of several $\mu$m thickness as material for the inductor. The '773 patent suggested that the polyimide may have thickness of 1 $\mu$m or greater. Contrary to the '773 patent, however, it is expected that a thickness of several tens $\mu$m is required, in order to prevent the inductor from affecting the integrated circuit therebelow. Further, the '773 patent has limitation that temperature of the process for forming the dielectric layer should not affect the integrated circuit therebelow.

As an another technique, a method of floating an inductor over a substrate was suggested. This method was suggested by J. Y. Park, et al. in Micro-machined High Q Inductors for High Frequency Applications, Proc. SPIE, vol. 3514, 1998, pp. 218–228. The method repeatedly performs the steps of forming a polyimide layer as a plating mold, forming metal layer at a predetermined area which is defined by the polyimide layer, and forming seed metal layer on the entire surface of the polyimide layer and the metal layer. The disclosed method utilizes non-conductive polyimide as a plating mold. Therefore, the method should form a seed metal layer on each and every layer in order to plate upper surface of every polyimide material by using the seed metal layer. This increases the number of processes. Also, the polyimide layer is easily deformed by upper layer processes, such as, processes of seed metal deposition and upper layer lithography. Further, because of seed metal layers which remain between inductors and supporting members, the inductors are not so tightly adhered to the supporting member.

DISCLOSURE OF INVENTION

It is therefore a principal object of the invention to provide a semiconductor device where a passive element, such as, an inductor, is floating over a substrate, where an integrated circuit is formed, by several tens of $\mu$m, such that the overall area of the semiconductor device may be highly reduced.

It is an another object of the invention to provide a monolithic semiconductor device where a passive element having small series resistance and large capacity of current flow is integrated.

It is a further object of the invention to provide a method for manufacturing a monolithic semiconductor device having passive elements formed over a substrate which contains integrated circuits, wherein the passive elements have negligibly little influence on the integrated circuits.

In accordance With one aspect of the present invention to achieve the aforementioned object, a method for manufacturing a semiconductor device having a substrate and a metal layer formed over the substrate is provided. The method comprises the steps of forming a first metal layer on the substrate; forming a second metal layer on a portion of the first metal layer such that side surfaces of the second metal layer and an upper surface of other portion of the first metal layer on which the second metal layer is not formed define a recess; forming a third metal layer on the first and second metal layers such that a portion of the third metal layer is located on a predetermined portion of the second metal layer and other portion of the third metal layer fills the recess;

removing the second metal layer; and removing a portion of the first metal layer which is not covered by the third metal layer.

In accordance with an another aspect of the present invention, a method for manufacturing a semiconductor device having a substrate and a metal layer formed over the substrate is provided. The method comprises the steps of: forming a first metal layer on the substrate; forming a first masking layer on a portion of the first metal layer; forming a second metal layer on other portion of the first metal layer on which the first masking layer is not formed; forming a second masking layer on the first masking layer and the second metal layer; removing the first masking layer and a portion of the second masking layer which includes a portion which covers the first masking layer; forming a third metal layer on portions of the first and second metal layers which are exposed by the step of removing the first masking layer and the portion of the second masking layer; removing the second masking layer; removing the second metal layer; and removing the first metal layer except a portion which the third metal layer covers.

In accordance with a further aspect of the present invention, a method for manufacturing a semiconductor device having a substrate and a metal layer formed over the substrate is provided. The method comprises forming a first metal layer 203 on the substrate 101; forming a first masking layer 204 on a portion of the first metal layer 203; forming a second metal layer 205 on other portion of the first metal layer 203 on which the first masking layer 204 is not formed; removing the first masking layer 204 to expose side surfaces of the second metal layer 205 and a surface of the portion of the first metal layer 203, such that the exposed surfaces define a recess; forming a third metal layer 102 on the first and second metal layers 203 and 205 such that the recess is filled with the third metal layer 102; removing a portion of the third metal layer 102 such that the portion which fills the recess is remained; forming a second masking layer 206 on the second and third metal layers 205 and 102; removing a portion of the second masking layer 206 which includes a portion which covers the third metal layer 102; forming a metal layer 102 on portions of the second and third metal layers 205 and 102 which are exposed by the step of removing the portion of the second masking layer 206; removing the second masking layer 204; removing the second metal layer 205; and removing a portion of the first metal layer 203 which is not covered by the third metal layer 102.

BRIEF DESCRIPTION OF DRAWINGS

The present invention will become more apparent upon a detailed description of the best mode for carrying out the invention as rendered below.

In the description to follow, references will be made to the accompanying drawings, where like reference numerals are used to identify like parts in the various views and in which:

FIGS. 8a–8i show a process for making various passive elements in accordance with the present invention.

BEST MODE FOR CARRYING OUT THE INVENTION

Figure 1:
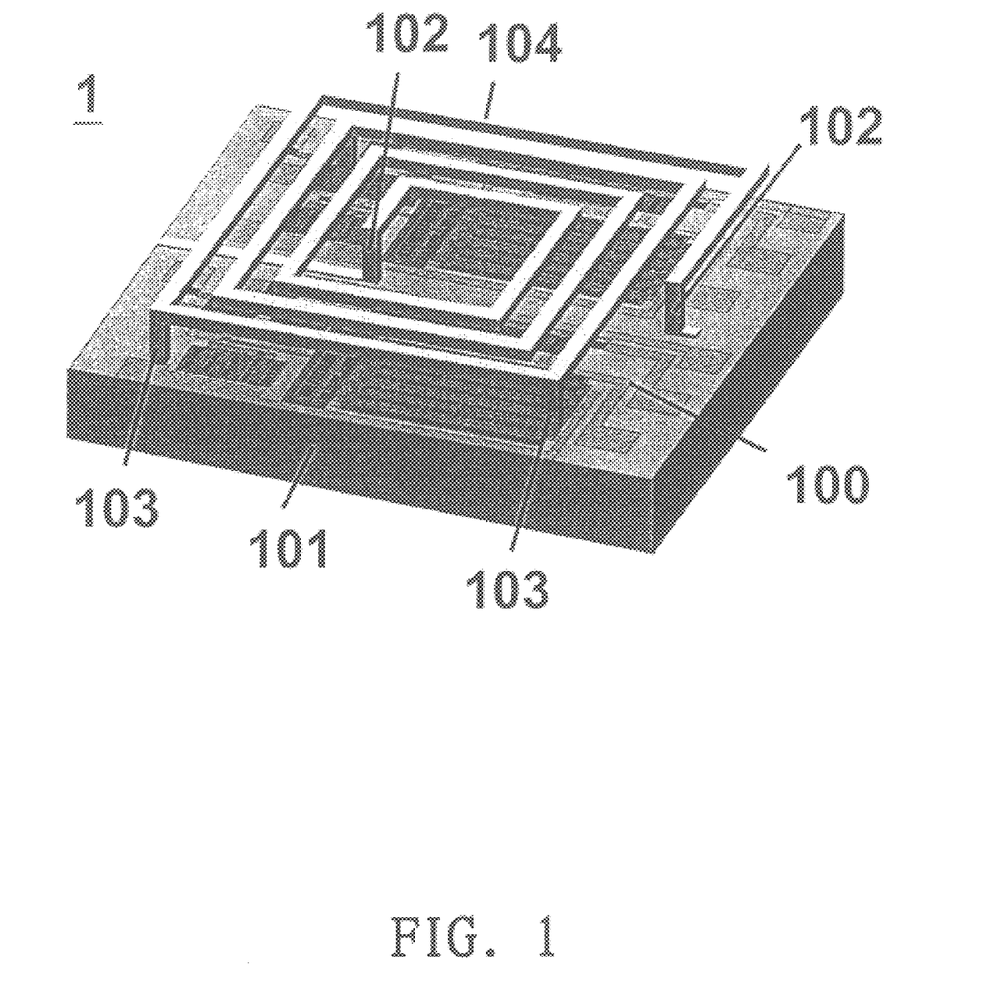
FIG. 1 shows a perspective view of a semiconductor device manufactured in accordance with the present invention.

FIG. 1 shows a perspective view of a semiconductor device manufactured in accordance with the present invention. The semiconductor device of FIG. 1 comprises a substrate 101 which contains integrated circuits and an inductor floating over the substrate. The inductor may comprise a pillar portion 102 connected to the integrated circuit on the substrate 101 and a spiral portion 104 supported by the pillar portion 102. The semiconductor device may further comprise a supporting member 103. According to the present invention, the three portions 101, 102 and 103 are made by a single step, e.g., a plating step.

FIGS. 2a–2f illustrate the method of manufacturing the semiconductor device in accordance with the first embodiment of the present invention.

Figure 2:
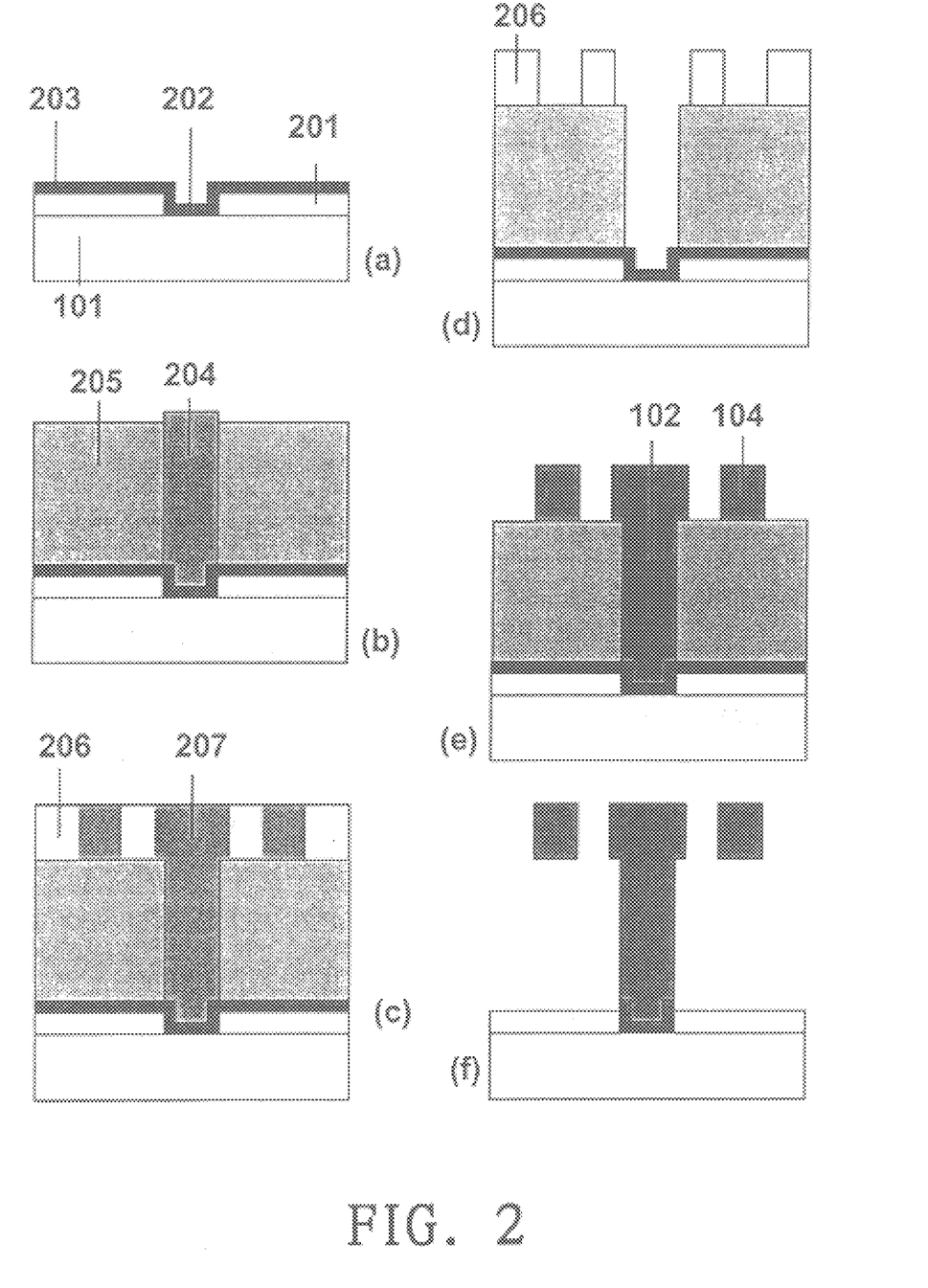
FIGS. 2a–2f illustrate the method of manufacturing the semiconductor device in accordance with the first embodiment of the present invention.

Referring to FIG. 2a, a protective layer 201 is formed over a substrate 101 which contains integrated circuits. The protective layer 201 protects and electrically isolates the integrated circuits in the substrate 101. The portion 202 which is not covered by the protective layer 201 will form a contact for connecting the integrated circuit to an element to be formed over the contact. Then, a seed metal layer 203 is deposited over the protective layer 201 and the portion of the substrate 202. The seed metal layer 203 may be deposited using vapor-deposition of TiW and Cu, which are generally used to prevent diffusion of Cu. In an embodiment of the invention, Ti and Cu was vapor-deposited with the thickness of 0.02 $\mu$m and 0.2 $\mu$m, respectively.

As shown in FIG. 2b, first photoresist mold 204 is formed on the seed metal layer 203. In the embodiment shown in FIG. 2b, the first photoresist mold 204 is formed on a predetermined portion of the seed metal layer 203 where a contact for the integrated circuit in the substrate 101 will be located later. The first photoresist mold 204 may be formed by using conventional lithography technique. The height and width of the first photoresist mold 204 may be selected according to the application of the semiconductor device. In an embodiment, the height and diameter of the first photoresist mold 204 was 55 $\mu$m and 20 $\mu$m, respectively. Then, it is preferable that the first photoresist mold 204 be exposed to ultraviolet radiation. This makes the first photoresist mold 204 to be easily removed at a developing step which will be described hereinafter.

Then, sacrificial metal mold 205 is formed on a portion of the first metal layer 203. The sacrificial metal mold 205 should not be formed on the predetermined area on which the photoresist mold 204 is formed. The sacrificial metal mold 205 may be formed by using conventional metal plating techniques, such as, nickel plating process. The sacrificial metal mold 205 will be eliminated later. By using the sacrificial metal mold 205, it is possible to float a passive element over the substrate. Therefore, the height of the metal mold 205 determines the height of the passive element to be formed. By employing the method in accordance with the present invention, it was possible to manufacture an inductor having 50 μm height over a substrate. This height cannot be expected from any known semiconductor manufacturing methods.

Referring to FIG. 2c, a second photoresist mold 206 is formed on the first photoresist mold 204 and the sacrificial metal mold 205. In the embodiment, the second photoresist mold 206 was formed with the thickness of 20 μm, by using the same method as that for the first photoresist mold 204.

Then, the first photoresist mold 204 and a portion of the second photoresist mold 206 which covers the first photoresist mold 204 are removed. This may be done by conventional development processes. The portion of the second photoresist mold 206, which is to be removed at this step, may be defined by exposing to ultraviolet radiation. As described above, if the first photoresist mold 204 was previously exposed to ultraviolet radiation, then it is possible to remove the portion of the second photoresist mold 206 and the whole first photoresist mold 204 at a single development step. FIG. 2d shows the resulting shape of the device after this removing step. The portion of the second photoresist mold 206 remained on the top surface of the sacrificial metal mold 205 defines the shape of the upper spiraling portion 104 of the inductor.

Then, metal is plated on the surfaces of the sacrificial metal mold 205 which were exposed by removing the first and second photoresist molds 204 and 206. In this embodiment, copper was plated with the thickness of 15 μm. As the plating step is continued, copper grows from the top and side surfaces of the sacrificial metal mold 205 that were exposed by removing the first and second photoresist mold 204. The copper growing from the top surface of the sacrificial metal mold 205 forms the spiraling portion of the spiral inductor 104. The copper growing from the side surface of the sacrificial metal mold 205 fills the space where the removed first photoresist mold (204) was located, and covers the predetermined area of the seed metal layer on which the first photoresist mold (204) was formed. In this way, the copper which fills the space where the first photoresist mold 204 was located forms the pillar for supporting the spiraling portion of the spiral inductor 104.

Then, the second photoresist mold 206 is removed by using organic solvent, such as acetone. FIG. 2e shows the resulting shape of the device after the second photoresist mold 206 was removed. The steps of FIGS. 2b through 2e may be repeated to form a passive element having a layered structure. By merely repeating the steps of FIG. 2b through 2e, a passive element having any number of layers may be produced.

Then, the sacrificial metal mold 205 is selectively removed, as shown in FIG. 2f. After this step, the spiraling portion of the spirial inductor 104 floats over the substrate by relying on the pillar 102 and the supporting member 103. The sacrificial metal mold 205 may be removed by conventional selective etching. In this embodiment, an etchant which selectively etches nickel with the etching selectivity of 400:1 was used. The etchant used in this embodiment may include an etchant entitled TOP RIP C-150 manufactured by OKUNO Chemical Industries, Co., Ltd. Alternatively, electro-chemical selective etching may be used. Then, the seed metal layer 203 except the predetermined area which the pillar 102 covers, is etched. In this way, an inductor in accordance with the present invention is manufactured, as shown in FIG. 2f.

FIGS. 3a–3f illustrate the method of manufacturing the semiconductor device in accordance with the second embodiment of the present invention. The second embodiment is different from the first embodiment in the steps of forming pillar portion 102 of the inductor.

Figure 3:
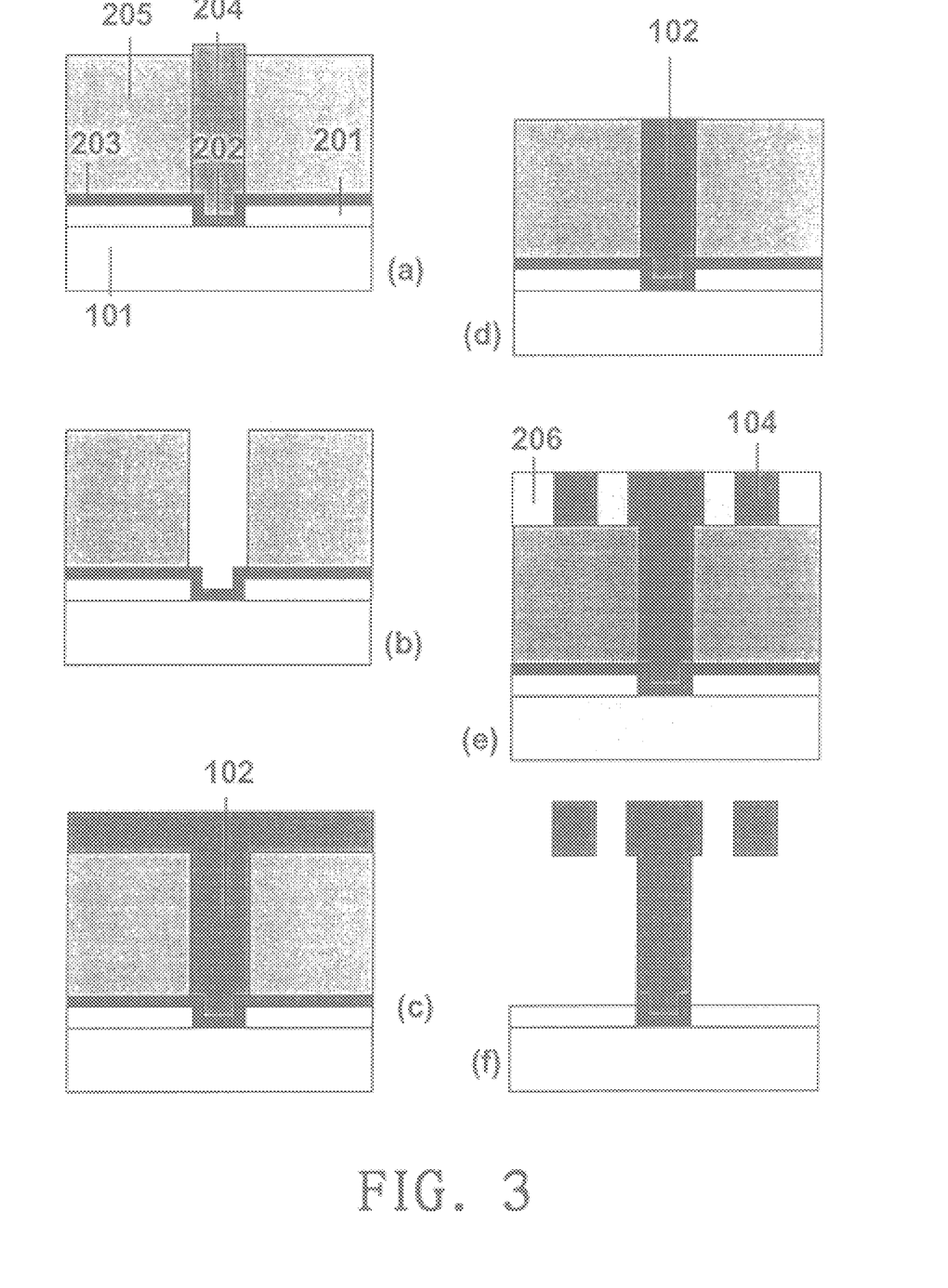
FIGS. 3a–3f illustrate the method of manufacturing the semiconductor device in accordance with the second embodiment of the present invention.

Referring to FIG. 3a, a protective layer 201, a seed metal layer 203, a first photoresist mold 204, and a sacrificial metal mold 205 are formed over the substrate 101, in the same way as shown in FIGS. 2a and 2b.

In the second embodiment of the invention, the photoresist mold 204 is removed, as shown in FIG. 3b. The photoresist mold may be removed by using conventional development process as the first embodiment.

Then, metal is plated on the top and side surfaces of the sacrificial metal mold 205 which were exposed by removing the photoresist mold 204, as shown in FIG. 3c. As the plating step is continued, copper grows from the top and side surfaces of the sacrificial metal mold 205.

Then, the portion of the metal which was formed on the top surface of the sacrificial metal mold 205 is removed. In this way, only the pillar portion 102 is remained, as shown in FIG. 3d. This may be done by using conventional polishing or etching techniques.

Referring to FIG. 3e, a second photoresist mold 206 is formed on the remained pillar portion 102 and the sacrificial metal mold 205. In the embodiment, the portion of the second photoresist mold 206 formed on the sacrificial metal mold 205 defines the spiraling portion of the inductor. Then, metal is plated on the top surfaces of the sacrificial metal mold 205 which is not covered by the second photoresist mold 206, as shown in FIG. 3c. The metal growing from the top surface of the sacrificial metal mold 205 forms the spiraling portion of the spiral inductor 104.

Then, the second photoresist mold 206 and the sacrificial metal mold 205 is selectively removed, in the same way as the first embodiment shown in FIGS. 2e and 2f. After this step, the spiraling portion of the spiral inductor 104 floats over the substrate by relying on the pillar portion 102. The spiral inductor manufactured according to the second embodiment has substantially the same shape as that of the first embodiment.

Figure 4A:
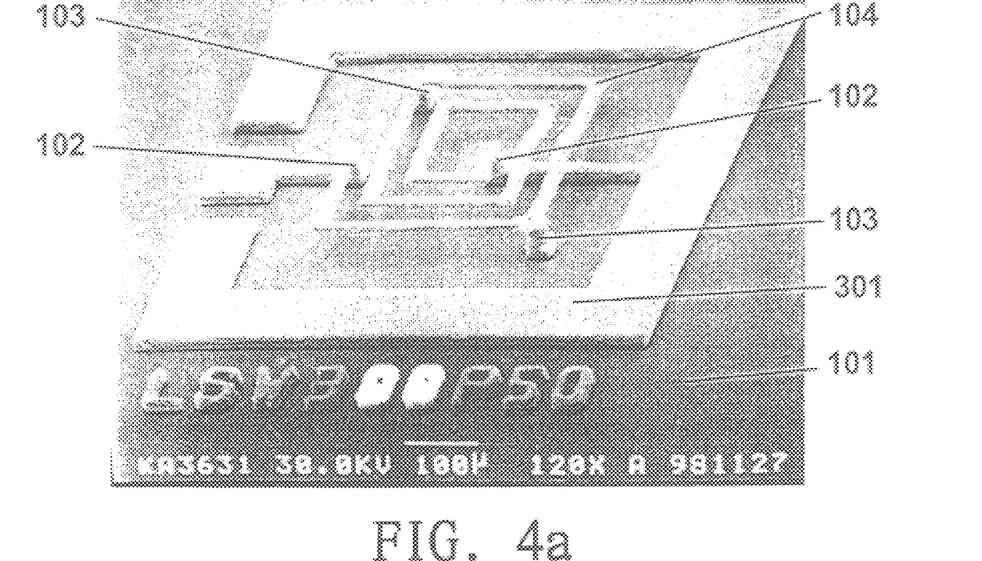
FIGS. 4a and 4b show Scanning Electron Microscope (SEM) photographs of an on-chip inductor fabricated in accordance with the present invention.
Figure 4B:
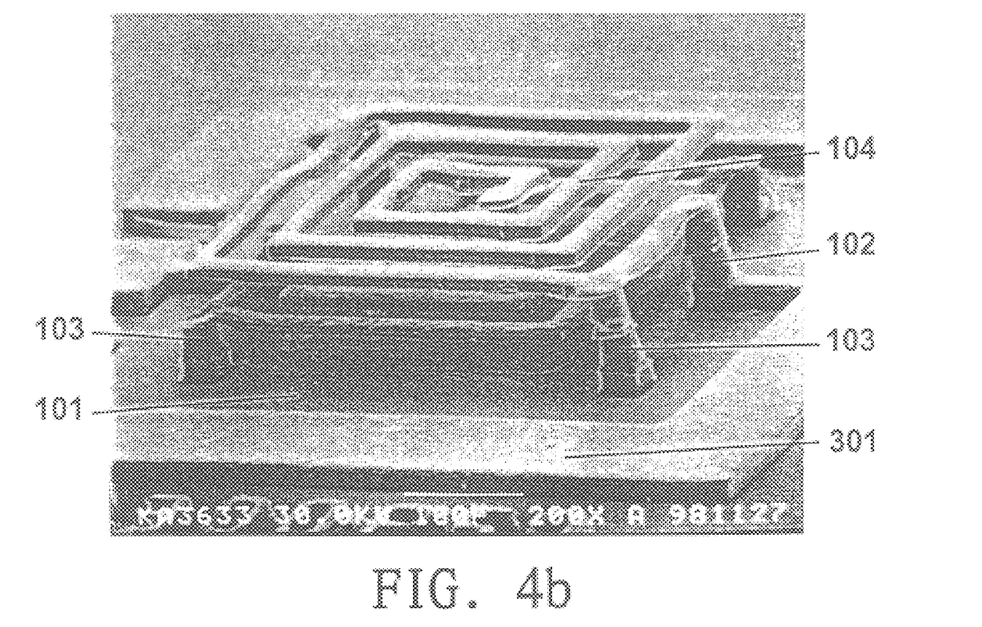

FIGS. 4a and 4b show Scanning Electron Microscope (SEM) photographs of an on-chip inductor fabricated in accordance with the present invention.

Bottom conductor 301, which was provided for the purpose of RF measurement in this example, may serve as a shelter for preventing external electromagnetic effect when it is connected to ground. The bottom conductor 301 may be formed by additional lithography and copper plating steps after the step of FIG. 2a.

In FIG. 4a, the spiral inductor 104 comprises a 2.5-turn spiraling portion of 15 μm in thickness and 20 μm in width. The spiral inductor 104 floats over the substrate by 50 μm. FIG. 4b shows a spiral inductor having stacked structure manufactured by repeating the steps of FIGS. 2b–2e. The gap between the upper and lower spiraling inductors was 45 μm.

Figure 5A:
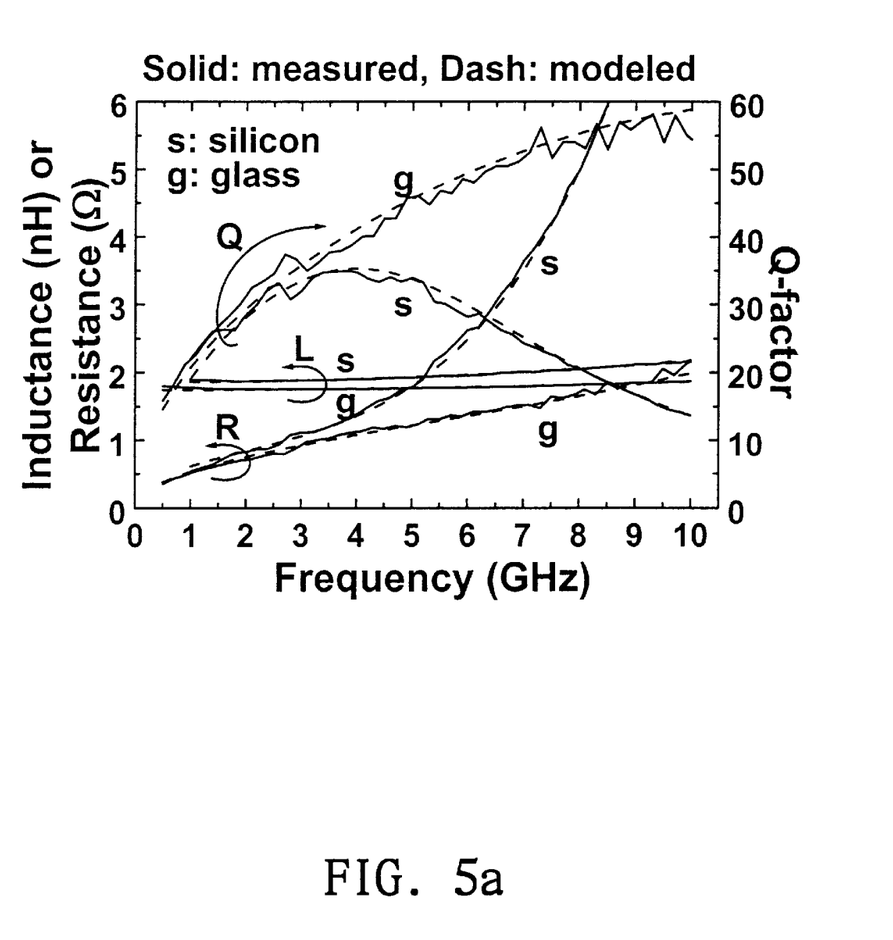
FIGS. 5a and 5b show RF characteristics of the inductors of FIGS. 4a and 4b, respectively.

FIG. 5a shows RF characteristics of the inductors of FIG. 4a, which are fabricated on a glass substrate and a silicon substrate. The glass substrate was made of product number #7740 produced by Corning, Co. The silicon substrate had (100) direction and was diffused by Boron with the resistivity of 1~20·Ωm. On the surface of the silicon substrate, a photoresist having thickness of 10 μm, was deposited as an insulator. FIG. 5a illustrates variation of resistance, inductance, and Q value for the inductor at the frequency band of 0.5~10 GHz. The solid line represents the result measured by experiment, while the dashed line represents simulation result by using equivalent circuit. The inductor on the glass substrate showed 1.8 nH inductance and maximum Q value of 57 at 10 GHz. The inductor on the silicon substrate showed 1.9 nH inductance and maximum Q value of 35 at 4 GHz.

Figure 5B:
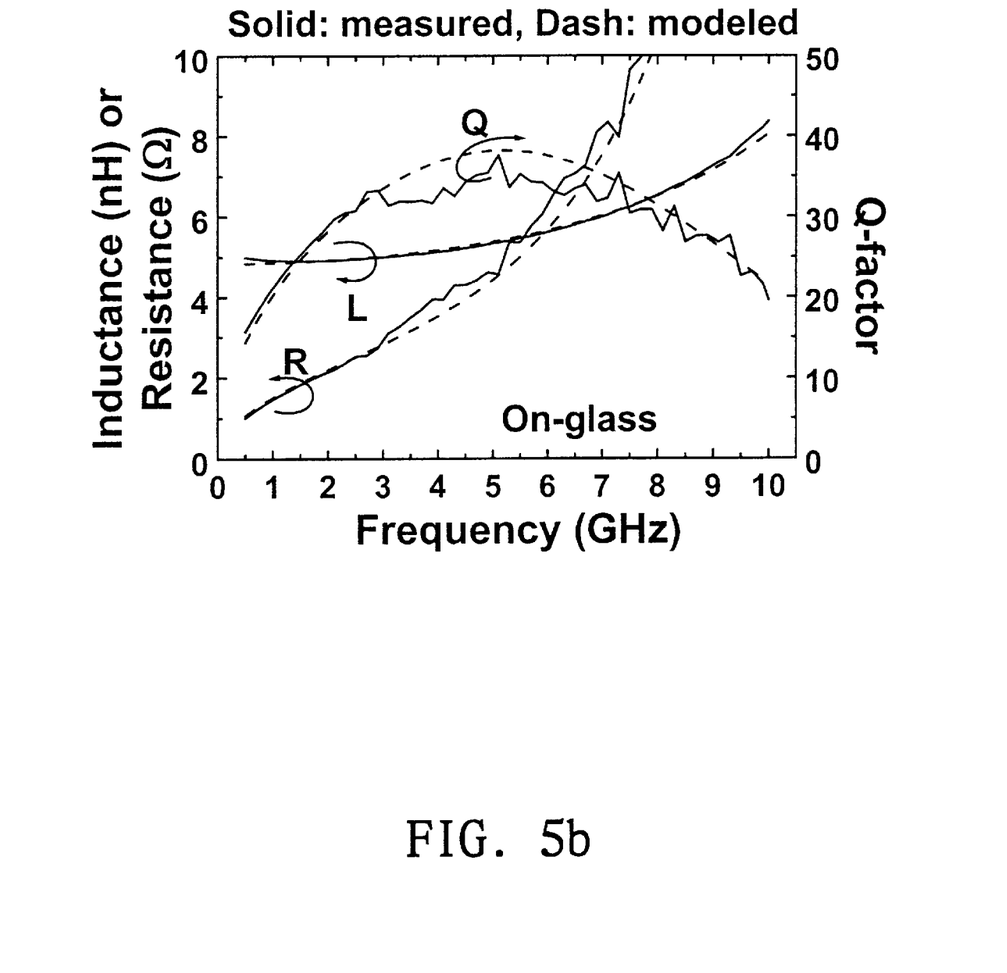

FIG. 5b shows RF characteristics of the inductor of FIG. 4b. As shown in FIG. 5b, the inductor of FIG. 4b has 5 nH inductance and maximum Q value of 38 at 5 GHz. As can be seen from FIG. 5b, an inductor having stacked structure may have an inductance of more than twice larger than a non-stacked inductor with the same area. Therefore, the present invention becomes more advantageous in view of its inductance value per unit area, when a stacked structure is employed.

As can be seen from FIGS. 5a and 5b, the electrical characteristic of the inductor in accordance with the present invention is superior to any inductors manufactured according to the conventional integration technique. Moreover, the present invention has additional merit in that the electrical characteristic of the inductor can be anticipated almost accurately by using simulation of equivalent circuit.

Figure 6:
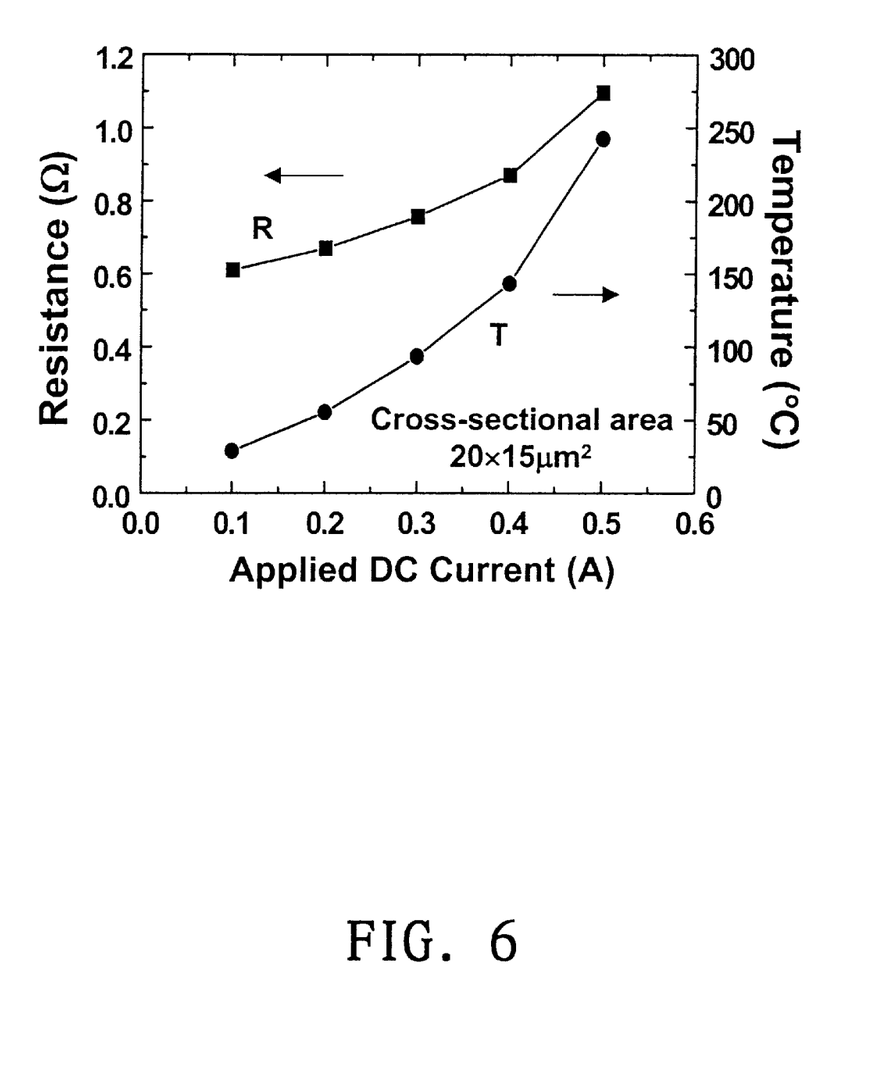
FIG. 6 shows resistance and temperature of the inductor manufactured. in accordance with the present invention.

FIG. 6 shows resistance and temperature of the inductor in response to current variation. Temperature of the inductor was evaluated by using general relationship between temperature and resistance of a conductor. For temperature coefficient of resistivity for copper, 0.00393/° C. was used. As shown in FIG. 6, current density of the inductor is 6×10$^4$ A/cm$^2$, when current is 180 mA at 50° C. and width and thickness of the inductor is 20 and 15 m, respectively. The current density is 100 times larger than that of a general macroscopic inductor, as described in *Transformer and Inductor Design Handbook*, New York Marcel Dekker, Inc., pp. 84–89, 1988. Therefore, it can be appreciated that the inductor of first embodiment of the present invention, which was made of copper having thickness of more than 10 $\mu$m, shows large limit of current flow.

Figure 7:
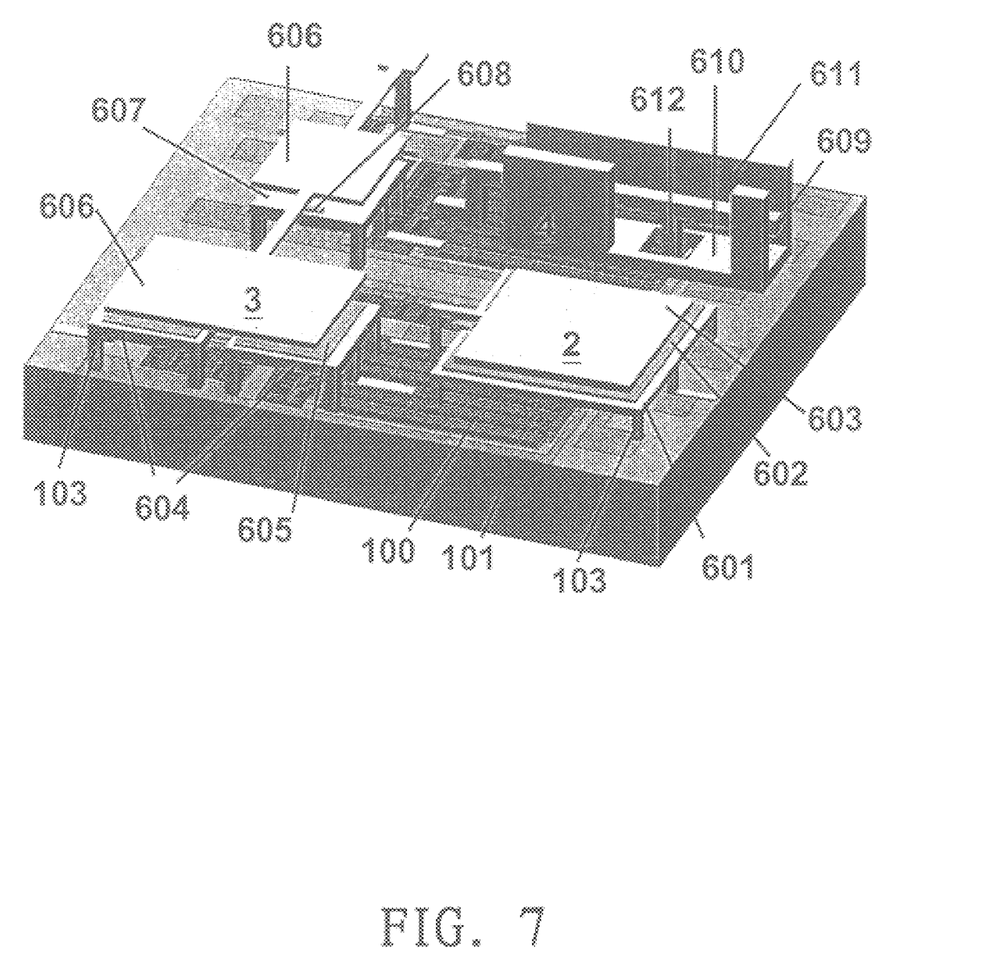
FIG. 7 shows perspective views of various passive semiconductor devices manufactured in accordance with the present invention.

FIG. 7 shows perspective views of various passive semiconductor devices manufactured in accordance with the present invention. Substrate 101 may also contain integrated circuits as the first embodiment of the present invention.

Capacitor 2 is formed by floating upper and lower planar electrodes 603 and 601 over substrate 101 in accordance with the present invention. The capacitor 2 occupies small area and shows low substrate loss, resistance loss, and large Q value.

Micro-switch 3 comprises upper and lower plates 606 and 604 manufactured in accordance with the present invention such that they float over the substrate. The lower plate 604 is fixed to the substrate. The micro-switch 3 further comprises control plate 607 fixed to the substrate and dielectric substance located between the upper and control plates 606 and 607 to prevent the upper plate 606 from contacting the control plate 607. If a voltage is driven between the upper and control plates 606 and 607, then the upper plate 606 moves toward the control plate 606 due to the electro-stactic attraction between them. If the upper plate 606 contacts the lower plate 604, current flows between the upper and lower plates 606 and 604. When a dielectric substance, such as the one which is generally used for capacitors, is located between the upper and lower plates 606 and 604, then high frequency signal may flow between the two plates even when the upper plate 606 is not in contact with the lower plate 604.

Waveguide 3 comprises signal line 609, bottom plate 610, two side plates 611, and supporting member 612 for supporting the signal line, manufactured in accordance with the present invention such that the signal line 609 floats over the substrate. The bottom plate 610 and side plates 611 are electrically connected to a ground. By this structure, wide band wave may be transmitted through the signal line 609 with small loss. The waveguide 3 may further comprise a plurality of additional supporting members 612, when the waveguide 3 is long.

FIGS. 8a–8i show a process for making various passive elements in accordance with the present invention.

Figure 8A:
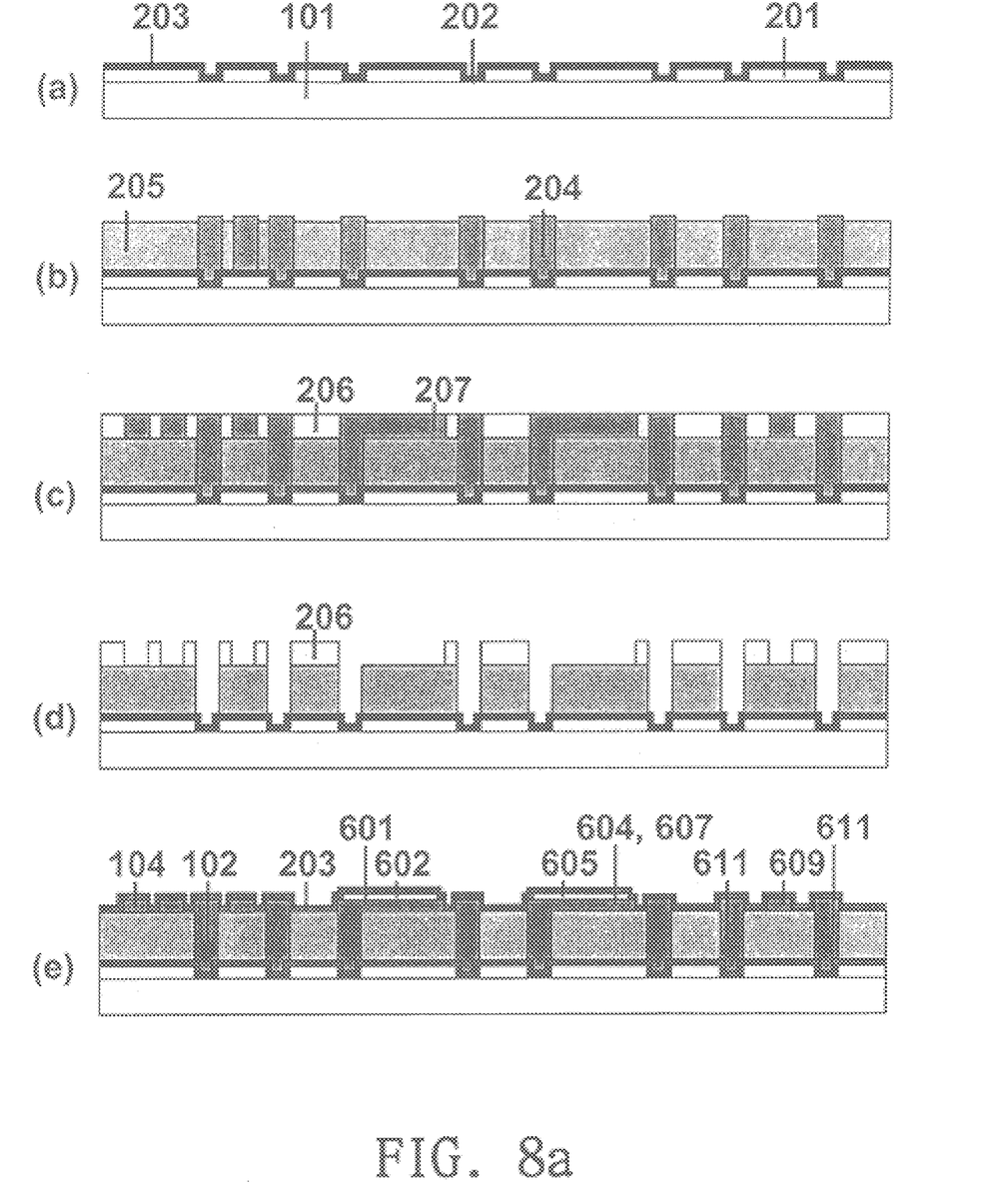
Figure 8B:
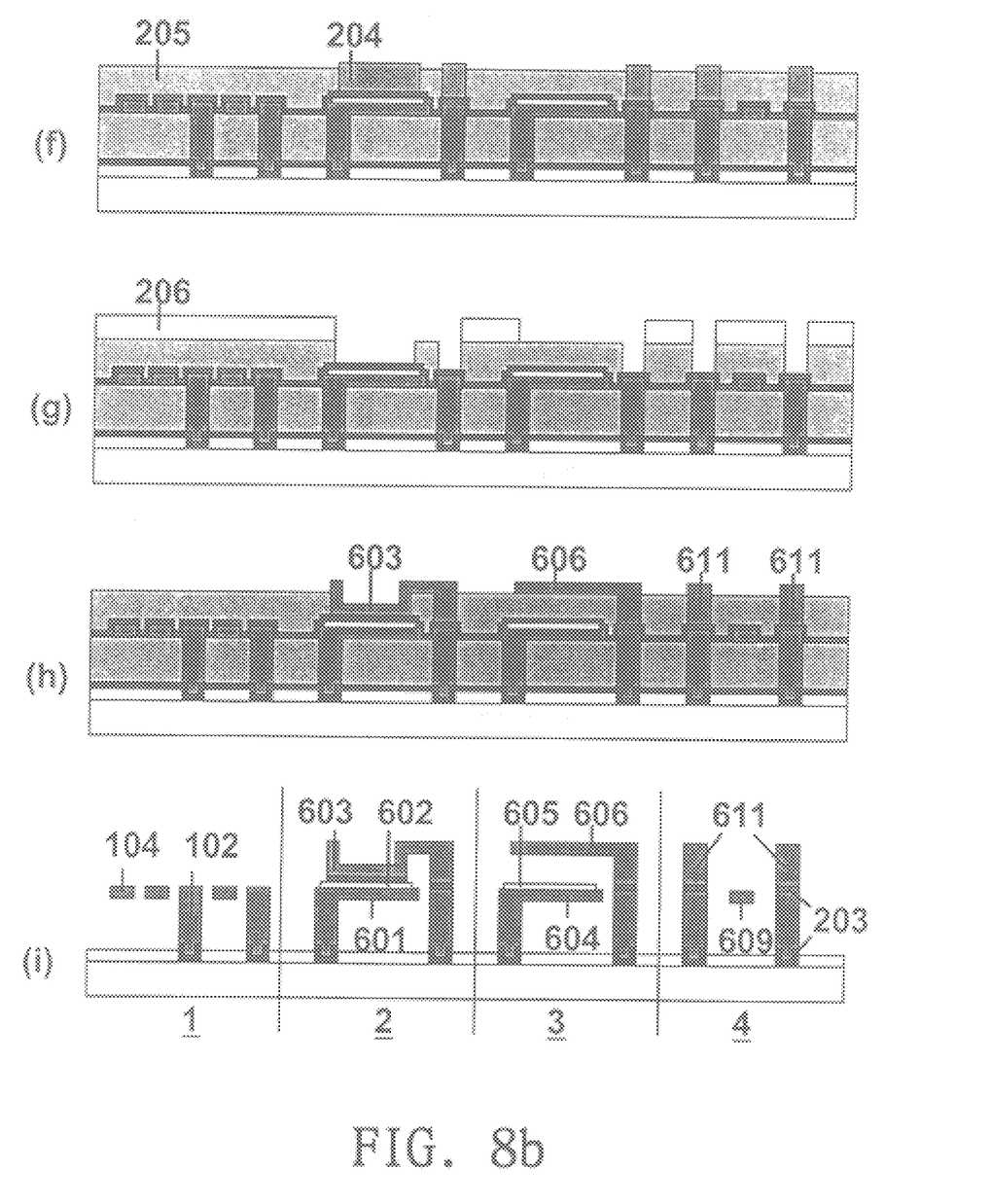

The steps of FIGS. 8a–8e are basically identical to the steps of FIGS. 2a–2e. The process further comprises steps of depositing dielectric substances for the capacitor and switch, and patterning and etching the deposited dielectric substances. The process further comprises steps of depositing seed metal layer 203 over the dielectric substances, from which plating is performed. FIG. 8e shows the shape of the device after the above steps are completed.

Then, the steps of FIGS. 2b–2e are repeated to form upper electrode 603 of a capacitor, upper plate 606 of a switch, and side plates 611 of a waveguide, as shown in FIG. 8h.

Finally, sacrificial metal mold 205 is selectively removed and a portion of the seed metal layer 203, which covers the substrate, is etched to isolate the passive elements from each other, in the same way as the step of FIG. 2f. The bottom ground plate 610 of waveguide 3 may be formed by additional lithography process. In this way, at least four kinds of passive elements may be formed on a substrate containing integrated circuits, by one manufacturing process.

The specification has described the idea of the present invention by using exemplary passive elements, i.e., inductor 1, capacitor 2, micro switch 3, and waveguide 4. However, the application of the present invention should not be restricted to those exemplary passive elements.

According to the present invention, passive electrical elements may be formed over a substrate which contains integrated circuits. In this way, the area for integrating various passive elements can be saved and the overall area for the semiconductor device including the integrated circuit and the passive elements may be reduced. Also, since passive elements are formed over a substrate, parasitic effect from the substrate can be significantly decreased. It is possible to make a metal line having a thickness which is larger than a metal line which can be manufactured by the conventional integration technique. Therefore, series resistance of passive elements is reduced and capacity of the current flow can be increased. Since the method in accordance with the present invention is composed of semiconductor lithography and plating processes, the method can be easily and accurately performed.

Industrial Applicability

The present invention can be applied to any kind of semiconductor devices which comprise passive elements, such as, inductors, capacitors, and resistors. Especially, the present invention can be applied to high-frequency devices, such as, RF ICs which require large inductance value. The present invention can be advantageously applied to various RF monolithic microwave ICs (MMICs) which require high-current inductor loads for RF power amplifiers.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method for manufacturing a semiconductor device having a substrate 101 and a metal layer floating over the substrate 101, the method comprising the steps of:

forming a first metal layer 203 on the substrate 101;

forming a second metal layer 205 on a portion of said first metal layer 203 such that side surfaces of said second metal layer 205 and an upper surface of other portion of said first metal layer 203 on which said second metal layer 205 is not formed define a recess;

forming a third metal layer 102 on said first and second metal layers 203 and 205 such that a portion of said third metal layer 102 is located on a predetermined portion of said second metal layer 205 and other portion of said third metal layer 102 fills said recess;

removing said second metal layer 205; and removing a portion of said first metal layer 203 which is not covered by said third metal layer 102.

2. The method of claim 1 further comprising the steps of:

forming integrated circuits on the substrate 101; and forming a protective layer on said circuits, before said step of forming said first metal layer 203 wherein said step of forming the first metal layer 203 forms said first metal layer 203 on said protective layer and a portion of said substrate 101 which is not covered by said protective layer.

3. The method of claim 1, wherein said step of forming the first metal layer 203 forms the first metal layer 203 on the substrate 101 by using vapor-deposition.

4. The method of claim 1, wherein said step of forming the second metal layer 205 is performed by plating the second metal layer 205 on said other portion of the first metal layer 203 using said first metal layer 203 as a seed metal for the plating.

5. The method of claim 1, wherein said step of forming the third metal layer 102 is performed by plating the third metal layer 102 on said portions of the second metal layer 205 using said second metal layer 205 as a seed metal for the plating.

6. The method of claim 1, wherein said step of removing said second metal layer 205 selectively removes said second metal layer 205 by using a selective etchant which etches only the second metal layer 205 between the second and third metal layers 205 and 102.

7. The method of claim 1, further comprising the steps of:

forming a fourth metal layer on a portion of said third metal layer 102 such that side surfaces of said fourth metal layer and an upper surface of other portion of said third metal layer 102 on which said fourth metal layer is not formed define a second recess;

forming a fifth metal layer on said third and fourth metal layers such that a portion of said fifth metal layer is located on a predetermined portion of said fourth metal layer and other portion of said fifth metal layer fills said second recess; and removing said fourth metal layer.

8. A method for manufacturing a semiconductor device having a substrate 101 and a metal layer floating over the substrate 101, the method comprising the steps of:

forming a first metal layer 203 on the substrate 101;

forming a first masking layer 204 on a portion of said first metal layer 203;

forming a second metal layer 205 on other portion of said first metal layer 203 on which said first masking layer 204 is not formed;

forming a second masking layer 206 on said first masking layer 204 and said second metal layer 205;

removing said first masking layer 204 and a portion of said second masking layer 206 which includes a portion which covers said first masking layer 204;

forming a third metal layer 102 on portions of said first and second metal layers 203 and 205 which are exposed by said step of removing said first masking layer 204 and the portion of said second masking layer 206;

removing said second masking layer 206;

removing said second metal layer 205; and removing a portion of said first metal layer 203 which is not covered by said third metal layer 102.

9. The method of claim 8 further comprising the steps of:

forming integrated circuits on the substrate 101; and forming a protective layer on said circuits, before said step of forming said first metal layer 203, wherein said step of forming the first metal layer 203 forms said first metal layer 203 on said protective layer and a portion of said substrate 101 which is not covered by said protective layer.

10. The method of claim 9, wherein said step of forming the first masking layer 204 forms said first masking layer 204 on a portion of said first metal layer 203 which is formed on said portion of the substrate 101 which is not covered by said protective layer.

11. The method of claim 8, wherein said step of forming the first metal layer 203 forms the first metal layer 203 on the substrate 101 by using vapor-deposition.

12. The method of claim 8, wherein said step of forming the second metal layer 205 is performed by plating the second metal layer 205 on said other portion of the first metal layer 203 using said first metal layer 203 as a seed metal for the plating.

13. The method of claim 8, wherein said step of forming the third metal layer 102 is performed by plating the third metal layer 102 on said portions of the second metal layer 205 using said second metal layer 205 as a seed metal for the plating.

14. The method of claim 8, wherein said step of removing said second metal layer 205 selectively removes said second metal layer 205 by using a selective etchant which etches only the second metal layer 205 between the second and third metal layers 205 and 102.

15. The method of claim 8, wherein said second and third metal layers 205 and 102 are made of nickel and copper, respectively.

16. The method of claim 8, wherein said second and third metal layers 205 and 102 are made of copper and nickel, respectively.

17. The method of claim 8 further comprising the steps of:

irradiating said first masking layer 204, after said step of forming the first masking layer 204; and irradiating said portion of said second masking layer 206, before said step of removing said first masking layer 204 and the portion of said second masking layer 206, and wherein said step of removing said first masking layer 204 and the portion of said second masking layer 206 removes said irradiated first masking layer 204 and said irradiated portion of said second masking layer 206 by development.

18. The method of claim 17, wherein said steps of irradiating use ultraviolet radiation.

19. The method of claim 8, further comprising the steps of:

forming a third masking layer 204 on a portion of said third metal layer 102, after said step of removing the second masking layer 206;

forming a fourth metal layer 205 on other portion of said third metal layer 102 203 on which said third masking layer 204 is not formed;

forming a fourth masking layer 206 on said third masking layer 204 and said fourth metal layer 205;

removing said third masking layer and a portion of said fourth masking layer which includes a portion which covers said third masking layer;

forming a fifth metal layer on portions of said third and fourth metal layers which are exposed by said step of removing said third masking layer and a portion of said fourth masking layer;

removing said fourth masking layer; and removing said fourth metal layer.

20. A method for manufacturing a semiconductor device having a substrate 101 and a metal layer floating over the substrate 101, the method comprising the steps of:

forming a first metal layer 203 on the substrate 101;

forming a first masking layer 204 on a portion of said first metal layer 203;

forming a second metal layer 205 on other portion of said first metal layer 203 on which said first masking layer 204 is not formed;

removing said first masking layer 204 to expose side surfaces of said second metal layer 205 and a surface of said portion of said first metal layer 203, such that the exposed surfaces define a recess;

forming a third metal layer 102 on said first and second metal layers 203 and 205 such that said recess is filled with said third metal layer 102;

removing a portion of said third metal layer 102 such that the portion which fills said recess is remained;

forming a second masking layer 206 on said second and third metal layers 205 and 102;

removing a portion of said second masking layer 206 which includes a portion which covers said third metal layer 102;

forming a metal layer 102 on portions of said second and third metal layers 205 and 102 which are exposed by said step of removing the portion of said second masking layer 206;

removing said second masking layer 204;

removing said second metal layer 205; and removing a portion of said first metal layer 203 which is not covered by said third metal layer 102.

21. The method of claim 20 further comprising the steps of:

forming integrated circuits on the substrate 101; and forming a protective layer on said circuits, before said step of forming said first metal layer 203, wherein said step of forming the first metal layer 203 forms said first metal layer 203 on said protective layer and a portion of said substrate 101 which is not covered by said protective layer.

22. The method of claim 21, wherein said step of forming the first masking layer 204 forms said first masking layer 204 on a portion of said first metal layer 203 which is formed on said portion of the substrate 101 which is not covered by said protective layer.

23. The method of claim 20, wherein said step of forming the first metal layer 203 forms the first metal layer 203 on the substrate 101 by using vapor-deposition.

24. The method of claim 20, wherein said step of forming the second metal layer 205 is performed by plating the second metal layer 205 on said other portion of the first metal layer 203 using said first metal layer 203 as a seed metal for the plating.

25. The method of claim 20, wherein said step of forming the third metal layer 102 is performed by plating the third metal layer 102 on said portions of the second metal layer 205 using said second metal layer 205 as a seed metal for the plating.

26. The method of claim 20, wherein said step of removing said second metal layer 205 selectively removes said second metal layer 205 by using a selective etchant which etches only the second metal layer 205 between the second and third metal layers 205 and 102.

27. The method of claim 20, wherein said second and third metal layers 205 and 102 are made of nickel and copper, respectively.

28. The method of claim 20, wherein said second and third metal layers 205 and 102 are made of copper and nickel, respectively.

29. The method of claim 20 further comprising the step of irradiating said portion of said second masking layer 206 with ultraviolet radiation, before said step of removing the portion of said second masking layer 206, and wherein said step of removing the portion of said second masking layer 206 removes said irradiated portion of said second masking layer 206 by development.

* * * * *